United States Patent [19]
Heckner et al.

[11] Patent Number: 5,969,942
[45] Date of Patent: Oct. 19, 1999

[54] MEANS FOR THE VENTILATION OF ELECTRICAL AND ELECTRONIC EQUIPMENT AND SUBASSEMBLIES

[75] Inventors: Helmut Heckner, Vilshofen; Thomas Rickinger, Arnstorf; Josef Neblich, Wartenberg; Werner Spateneder, Pfarrkirchen, all of Germany

[73] Assignee: Knuerr-Mechanik fur die Electronik Aktiengesellschaft, Munich, Germany

[21] Appl. No.: 09/124,364

[22] Filed: Jul. 29, 1998

[30]     Foreign Application Priority Data

Jul. 31, 1997 [DE]  Germany ............................ 197 33 134

[51] Int. Cl.$^6$ ....................................................... H05K 7/20
[52] U.S. Cl. .......................... 361/695; 361/685; 361/687; 361/741; 165/121; 165/140; 454/184; 312/236
[58] Field of Search ..................................... 361/683, 818, 361/741, 752, 225, 685–688, 690–695; 415/213.1; 454/184; 327/564; 62/259.2; 174/16.1; 165/122, 121, 140, 41, 80.4; 312/236; 180/68.4, 68.1; 416/194, 195

[56]                References Cited

U.S. PATENT DOCUMENTS 4,214,706  7/1980  Gee et al. .

5,210,680  5/1993  Scheibler ................................ 361/384

FOREIGN PATENT DOCUMENTS 0 470 926 A1  2/1992  European Pat. Off. .
  1 908 825  9/1970  Germany .
34 17 451 C2  6/1986  Germany .

*Primary Examiner*—Leo P. Picard
*Assistant Examiner*—Michael Datskovsky
*Attorney, Agent, or Firm*—Larson & Taylor

[57]                ABSTRACT

A device for ventilating electronic and electrical equipment, subassemblies and components, which are placed in casings, cabinets and subassembly carriers. The device is particularly suitable for slide-in fan modules, which are equipped with axial flow fans and positioned at a relatively small distance from a reception space for the electrical and electronic equipment, etc. to be ventilated. Between the objects to be cooled and the fan unit is provided an air distribution plate, which has punched out air passage openings. In order to achieve a diffuser action and partial direction change of an air volume flow, air deflecting surfaces with a predeterminable inclination and in clearly defined areas are formed by a punching and bending process.

11 Claims, 3 Drawing Sheets

5,969,942

MEANS FOR THE VENTILATION OF ELECTRICAL AND ELECTRONIC EQUIPMENT AND SUBASSEMBLIES

The invention relates to a means for ventilating electronic and electrical equipment, subassemblies and components, which are placed in casings, cabinets, frames and subassembly carriers.

The invention is more particularly intended for slide-in fan modules, which are placed in frames and cabinets below or between subassembly carriers and/or equipments. However, the invention is also suitable for LAN cabinets and equipment cabinets, in which e.g. an air duct is provided and an air volume flow is supplied with the aid of a fan, a fan system, a blower or a central air conditioning or ventilation system, which must be split up as a function of the necessary cooling or the formation of hot spots into clearly defined and planned oriented partial air flows.

BACKGROUND OF THE INVENTION

Known slide-in fan modules generally have axial flow fans with vertically oriented fan axes and upper air exit sides. The slide-in fan modules are provided with a cover, which in the vicinity of air exit faces has circular openings.

As a result of a relatively large hub area, in the centre of the axial flow fan and in regions between and outside the air exit faces, so-called "dead areas" arise, in which there is no or only a limited air flow. These "dead areas" have a particularly disadvantageous effect in means or systems, where the slide-in fan modules, in order to save installation space, are positioned at a very limited distance from a reception space with the equipments, subassemblies, components or other objects to be cooled or ventilated. Hot spots can then be formed, which give rise to problems or even to the failure of an equipment, subassembly, etc.

EP 470 926 A1 discloses a ventilation means for consoles equipped with printed circuit boards, in which at least one cooling air-sucking in blower is provided spaced from a reception space for parallel circuit boards. On the lower guide elements engages an air distribution plate, which is placed in the grid of guide elements for the minimum circuit board openings for the blower cooling air flow. Between the blower outlet or an upper edge of a fan slide-in module and the air distribution plate, a storage capacity is formed on the underside of the guide elements where, as a result of the minimum openings and baffles located therein, a pressure is formed, which is intended to lead to a uniform, directed flow. As a result of the height of the storage capacity, which roughly corresponds to that of the fan, an equalizing section is defined. A disadvantage associated therewith is the reduction of the installation space of a cabinet, frame or casing, which is contrary to the constantly increasing demand for an optimum utilization of the installation space.

DE 34 17 451 C2 discloses a slide-in casing constructed for EMC shielding and ventilation from two-shell plates. Each shell is provided with vent openings, which have a slot-like construction and in the case of two adjacent shells are not aligned with one another, which leads to a wave-like flow of the air passing through. The casing is made from plastic and is provided on the inside and/or outside with an electrically conductive coating.

An electrical device with thermally highly loaded electrical components of plate-like carriers described in DE-OS 1 908 825 has cooling lines between the components, which are fixed to the carrier plates in such a way that their slot-like exit openings are directed onto the components.

U.S. Pat. No. 4,214,706 discloses a cooling system for equipment cabinets and circuit boards and subassemblies arranged therein, which has a ventilation chamber with a rectangular cross-section. The outer walls of the ventilation chamber, which are directed towards the circuit boards and electrical sub-assemblies, have elongated openings. To obtain a uniform pressure in the ventilation chamber connected with a frontally positioned blower, a partition with round holes is provided, so that two partial chambers are formed.

SUMMARY OF THE INVENTION

The object of the invention is a means for ventilating objects, particularly electrical and electronic equipment, subassemblies and components in reception spaces of cabinets, containers, subassembly carriers, etc., which in
 a space-saving arrangement permits an effective ventilation in pre-determinable areas of a reception space and both a directed air flow and an also almost uniform ventilation, e.g. over a module cross-section.

According to the invention, a means for ventilating electrical and electronic equipment, subassemblies and components in a reception space of a casing, cabinet or subassembly carrier, has an air distribution plate with air passage openings and air deflecting surfaces upstream of the electrical and electronic equipment, subassemblies and components to be ventilated, which extends over virtually the entire surface of the reception space or a fan unit and is located and in particular supported on the axial flow fan or fans, the air passage openings and air deflecting surfaces being arranged and constructed in a manner adapted to the construction and arrangement of the axial flow fans and ensuring a ventilation over the entire surface of the air distribution plate and reception space.

A fundamental idea of the invention is to provide in an air volume flow a plate or sheet-like air distributor without any storage capacity. In a volume flow in this context is understood to mean an air volume produced by several fans, blowers, etc., which is supplied to the objects to be ventilated and which are e.g. placed in a reception space.

The air distribution plate is constructed in such a way that the air volume flow is at least partly subject to a direction change. In that in planned and adjustable manner at least partial air flows are deflected, it is possible to set a uniform air distribution over a surface and/or an increased or also reduced ventilation in predeterminable areas.

Appropriately the air distribution plate has air passage openings, which are constructed in such a way that, as desired, air deflecting surfaces can be formed. The air deflecting surfaces are formed in predeterminable areas of the air distributor and on one and/or both sides on the air distributor, in order to bring about a direction change of at least partial air flows and a cooling of clearly defined areas and objects. To this end, the air deflecting surfaces are constructed on bent areas or areas inclined to the exit direction of the air volume flow and preferably on punched areas, which are subsequently also referred to as punchings.

It is particularly advantageous to use as the air distributor a flat material, particularly a steel sheet or plate, in which the air passage openings with and without air deflecting surfaces can be made in a single punching process. The production of such an air distribution plate is particularly rational and involves relatively low costs.

It is particularly advantageous that the air passage openings can be produced as blankings with different geometries and sizes, but preferably as slots or elongated holes.

As the air deflecting surfaces are also initially produced by punching, but with at least one punctiform or surface connection, following punching it is merely necessary to bent up and/or down the punched areas. It is advantageous that the punching and bending process can be carried out with a single tool.

The air distribution plate for fan units or slide-in fan modules according to the invention can be used particularly effectively in fan systems with axial flow fans which, due to the integrated drive motors, generally have a relatively large hub area. The air passage openings with upwardly and/or downwardly inclined punched areas and air deflecting surfaces can deflect the partial air flows to the hub areas as a result of a direction change. In this way "dead areas" are bridged or eliminated.

It is particularly appropriate to provide an air distribution plate with openings, which are constructed in complimentary manner to and bear on the hub areas of the fan means and can be arranged in a virtually self-adjusting and/or locking manner in the slide-in fan module.

The elongated holes as air passage openings are appropriately so arranged and dimensioned, that they are in operative connection with the inclined punched areas having the air deflecting surfaces, in order to ensure the necessary air distribution and air flow to the reception space to be ventilated, whilst avoiding hot spots.

It is particularly advantageous to have blankings or punched areas, which are set or tilted in a lamellar manner.

Preferably, the punched areas are punched in a roughly rectangular manner. The term tilted air deflecting surfaces is understood to mean punchings, which in the region of one longitudinal side and optionally over the entire longitudinal side, can be bent or angled. A tilted punching with an air deflecting surface can consequently either project from the bottom or from the top of the air distribution plate. As a function of the objects to be ventilated, an air distribution plate can have both downwardly and upwardly tilted punchings or air deflecting surfaces.

Lamellar-settable punchings with two air deflecting surfaces are particularly advantageous with respect to their construction and their diffuser effect. With punchings for lamellar air deflecting surfaces, in the vicinity of the short sides of the rectangular blanking areas are provided connecting webs, which are bent or turned for the inclining of the blankings and for forming the air deflecting surfaces. Thus, the lateral connecting webs form a setting or rotating axis for the lamellar punchings. Their air deflecting surfaces project downwards and upwards over the air distribution plate.

Advantageously, through a concentric or eccentric arrangement of the connecting webs on the short sides of the rectangular punchings, it is possible to predetermine the proportion of downwardly and upwardly directed air deflecting surfaces and consequently the deflecting action thereof. Generally the proportion of air deflecting surfaces directed towards the fan, i.e. downwards is greater, so as to bring about a direction change of the air volume flow below the air distribution plate, so that the air passage openings, without tiltable or settable air deflecting surfaces, can take over the sought distribution of the air volume flow.

Appropriately the punchings for forming the air deflecting surfaces are formed at least in regions above the air exit faces of the individual fans. For a direction change of the air volume flow of a single fan, it is e.g. possible to have four rectangular punched areas in the manner of a square pattern about the opening in the hub area. Between the rectangular punchings for the air deflecting surfaces arranged in the manner of a square, can be provided radially oriented elongated holes as air passage openings. It is also appropriate to arrange radially outwards further punched areas, preferably in corner bevel-like manner, and to set, bend up or down same in louvre-like manner.

Outside the air exit faces of the fans, i.e. in the "dead areas", particularly between the fans and in marginal areas, are provided completely punched through air passage openings, particularly elongated holes.

In order to allow individual cooling effects, the elongated holes can be closed or covered with corresponding elements. It is alternatively possible to provide slip-on or plug-in air deflecting elements.

Advantageously the tiltable or lamellar-settable punched areas can be constructed virtually flat or slightly curved. The air distribution plate can also be constructed in such a way that the bending process for the connecting webs and the angling of a tilting leg can be cancelled out again, so as to bring about in situ a modified ventilation program.

Production advantages result from the fact that the virtually rectangular punched areas can be tilted or set in lamellar manner, without using special tools. In a particularly efficient production, the punching process and the bending process for the lamellar setting or tilting can be performed in a single tool.

According to a further development, the air deflecting surfaces of the tilted and/or lamellar-set punched areas are enlarged by additional elements and/or that at least one air passage opening of the two such openings formed by the lamellar setting can be at least partly covered or closed. A further direction change of a partial air flow can be brought about by additional elements. The cooling of specified equipments, subassemblies or components can also be reduced when covers are used.

The at least partial covering or closure of passage openings in the vicinity of the air deflecting surfaces, or also the slot-like or elongated hole-like air passage openings, can take place in numerous different ways. Use can be made of grid-like, clip-on cover elements or seal-on, additional elements, which can be removed again when necessary.

It is essential to have a planned direction change and control of the ventilation and at the same time a diffuser-like air distribution.

When the air distribution plate according to the invention is used in an equipment cabinet or LAN cabinet, the possibility exists of providing it as a partition between a vertical or horizontal air duct and the reception space.

For example, a vertically positioned air distribution plate can be provided as a rear wall or at least one side wall. An air volume flow can be formed by a fan or a fan system, a blower or an air pressure line. If e.g. between a rear wall, in which an axial flow fan system is provided, and an air distribution plate, a ventilation duct is formed, through a planned construction of the air distribution plate it is possible to create cabinet areas with different cooling effects or also warm areas.

According to a further development, above an air distribution plate or between an air distribution plate and the objects to be cooled, a further diffuser can be provided. Said further air distributor can e.g. be constructed as a perforated plate. Preferably blankings are constructed over the entire surface of the further air distributor. Said further air distributor is more particularly used for equalizing at least one air wave, which is formed in the first air distributor plate by a direction change. It is possible to weaken the increased partial air flows and/or a further turbulence.

DESCRIPTION OF THE PREFERRED EMBODIMENT

Figure 1:
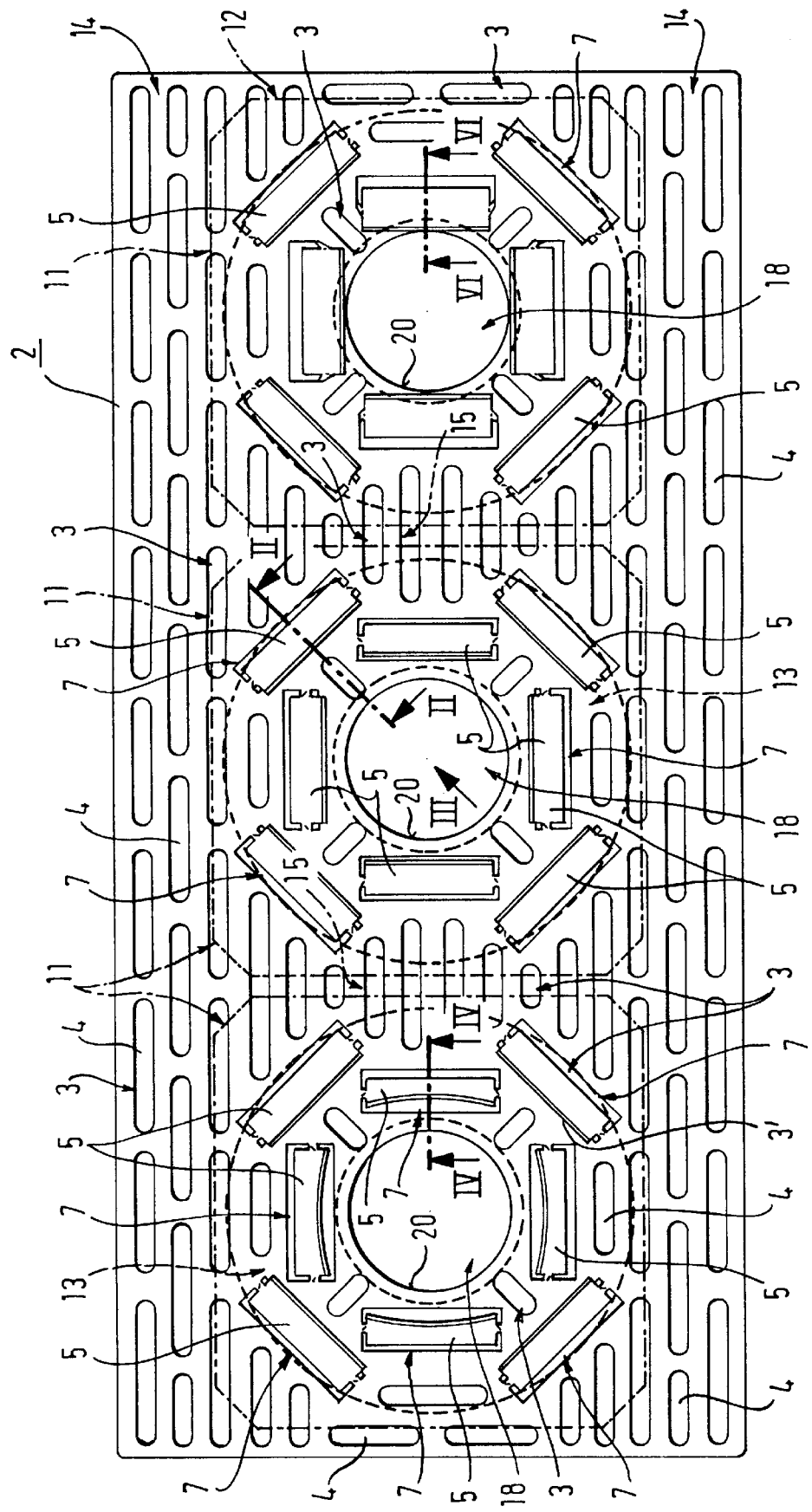

The invention is described in greater detail hereinafter relative to the attached, diagrammatic drawings, wherein show:

FIG. 1 A plan view of the air distributor plate for a slide-in fan module with three axial flow fans according to the invention.

Figure 2:
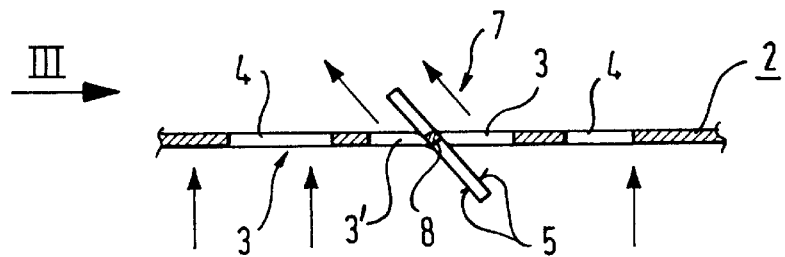

FIG. 2 A vertical section through a lamellar-set punched area along line II—II of FIG. 1.

Figure 3:
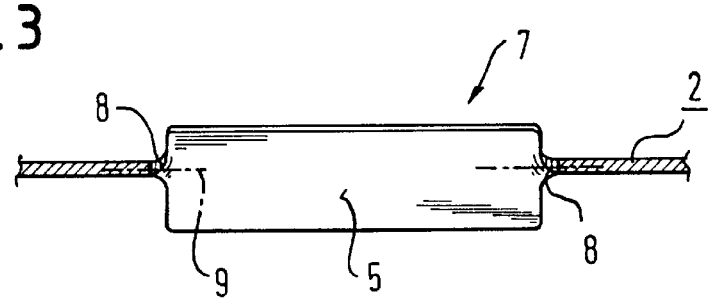

FIG. 3 A view of a lamellar-set punched area according to arrow III in FIGS. 1 and 2.

Figure 4:
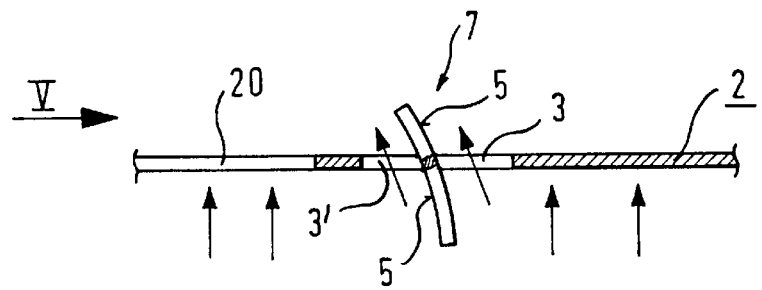

FIG. 4 A vertical section of a lamellar-set punched area along line IV—IV of FIG. 1.

Figure 5:
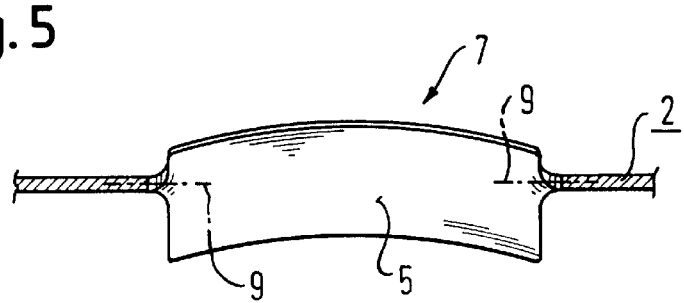

FIG. 5 A view of a lamellar-set punched area according to arrow V in FIG. 4.

Figure 6:
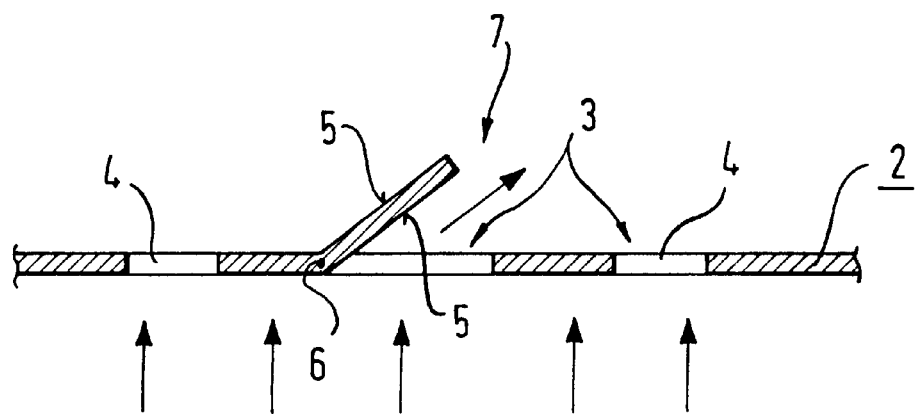

FIG. 6 An air deflecting surface formed by tilting a punching.

Figure 7:
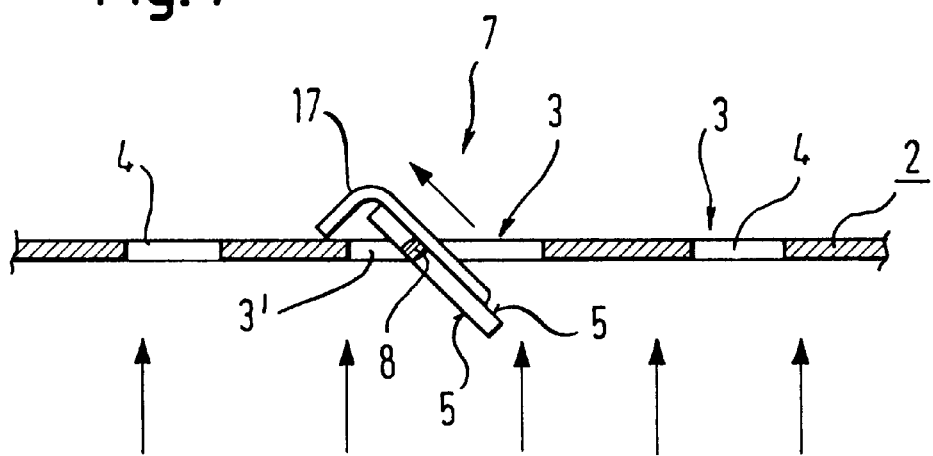

FIG. 7 A vertical section through a lamellar-set punched area with cover along line VI—VI of FIG. 1.

FIG. 1 shows an air distribution plate 2, which is intended for a slide-in fan module with in each case three juxtaposed axial flow fans 11. Such slide-in fan modules have the advantage of a relatively shallow construction. The axial flow fans produce a moderate volume flow, a moderate pressure and are relatively quiet. In the hitherto known slide-in fan modules a volume flow has only passed out in the vicinity of an exit face 13, so that only the electrical and electronic equipments, subassemblies, etc. located in the vicinity of a not shown reception space are cooled.

The air distribution plate 2 is dimensioned in such a way that the entire surface of a slide-in fan module and a complimentary air entrance face of the not shown reception space is covered.

The air distribution plate 2 is made from a flat or plate material, e.g. a steel sheet with a thickness of approximately 1.5 mm and is provided over the entire surface area with air passage openings 3, which are constructed as blankings and in this embodiment as elongated holes 4. In addition, air passage openings 3, 3' are formed on one or both sides of punchings or punched areas 7, when the latter are inclined after or during the punching process. Alternative constructions of the elongated hole-like or slot-like air passage openings 3 are possible.

In plan view circular air exit faces 13 of the axial flow fans 11 are shown in broken line form. The contours of the axial flow fans 11 below the air distributor 2 are represented by dot-dash lines.

FIG. 1 illustrates that the air distribution plate 2 is provided with a system of blankings 4 and punchings 7 for the air passage openings 3 and air deflecting surfaces 5 and that the blankings 4 and punchings 7 are constructed and arranged in such a pattern that an air flow volume is subject at least partly to a direction change and can be distributed, increased or decreased.

The punchings 7 in the vicinity of the air exit faces 13 are essential for the direction change and diffuser action of the air distribution plate 2. These punchings 7 are roughly rectangular and can be set in lamellar manner with a selectable inclination angle by means of connecting webs 8 on the short sides. As a result air deflecting surfaces come into effect, which deflect partial air flows in "dead areas".

FIGS. 2 to 5 show lamellar-set or inclined punched areas 7. It is alternatively possible to form bent or tilted punchings 7 (cf. FIG. 6).

The fan unit 12, which in FIG. 1 comprises three individual fans 11, is covered by an air distribution plate 2, which simultaneously serves as a protection against unintentional contact with the not shown fan wheels. The uncomplicated arrangement through a support in the hub areas 18 of the fans 11 is particularly advantageous.

For this purpose, complimentary openings 20 are formed in the air distribution plate 2. Coaxial to said openings 20 are formed rectangular punchings 7 in the form of a square and these are set in lamellar manner in the embodiment of FIG. 1. In the corner regions of the square are formed radially positioned elongated holes in radially outward direction and arranged in corner bevel-like manner are connected further punchings 7. The latter are so set that marginal areas 14 and/or intermediate areas 15 of the air distributor 2 or the reception space are ventilated. The internal punchings 7, set in the manner of a square, with air deflecting surfaces 5 are set in such a way that partial air flows are deflected to the hub area 18.

FIGS. 2 to 5 show possible constructions of lamellar-set punchings 7. As a result of the inclined position of the punchings 7 two air passage openings 3, 3' are formed (FIG. 2). The direction of the partial air flows, which is indicated by arrows, is defined by the inclination angle of the punchings 7 and is predeterminable. The punching according to FIG. 2 has connecting webs 8, which are arranged eccentrically on the short sides of the punchings 7, so that a larger proportion of the air deflecting surfaces 5 of the punchings 7 projects over and acts on the underside of the air distributor 2.

FIG. 3 illustrates that the air deflecting surfaces 5 of the punchings 7 according to FIG. 2 are planar. Identical features in the drawings are given identical reference numerals.

An alternative construction of the lamellar-set punchings can be gathered from FIGS. 4 and 5. The difference compared with the punchings 7 according to FIGS. 2 and 3 is that the punching and consequently the air deflecting surfaces 5 have a slightly curved construction. To achieve a deflection of the air volume flow over areas positioned outside the air exit face 13 of an axial flow fan 11, the arcuately formed punched areas 7 are so punched out that a larger area of the air deflecting surfaces 5 projects in the direction of the not shown axial flow fans from the underside of the air distribution plate 2. The deflection of the air volume flow by the air deflecting surfaces 5 is once again indicated by arrows. It is clear, with reference to FIG. 1, that as a result of punchings 7 constructed and set in this way, an area above the hubs 18 can be supplied with cooling air.

FIG. 6 shows another alternative construction of the air deflecting surfaces 5. An almost rectangular punched area 7 is bent upwards by means of a tilt axis 6 in the vicinity of a longitudinal side of the punchings 7. The punchings 7 can be bent downwards or upwards, as a function of the direction in which a partial air flow (see arrow) is to be directed. An air passage opening 3 is formed by tilted or angled punchings 7. The lamellar-set or tilted punchings 7 can optionally be pressed flat and virtually cancelled out again, should this prove necessary, e.g. in the case of a modified loading of a reception space.

FIG. 7 shows a lamellar-set punching 7, which has at least two air passage openings 3, 3' and air deflecting surfaces 5. In order to create a further possibility for influencing an air volume flow, particularly of a slide-in fan module, an additional element 17 is positioned in such a way that an air passage opening 3 is at least partly covered or closed. Such a covering or closing of one of the two air passage openings 3, 3' leads to a local reduction and modified distribution of the air partial flows through the air passage openings 3, 3', constructed with or without air deflecting surfaces 5 in a single punching process.

We claim:

1. A ventilating apparatus comprising:
   a fan unit with axial flow fans which generate ventilating air flows, each said flow fan including a circular air exit face;
   a reception space which is ventilated by the ventilating air flows; and
   an air distribution plate positioned upstream of said reception space, said air distribution plate including air passage openings and air deflecting surfaces and covering essentially an entire surface of said fan unit, hub openings placed respectively adjacent each of said flow fans,
      a respective air exit area adjacent each respective said air exit face of said flow fans, and
      for each said air exit area, air passage openings and air deflecting surfaces arranged in a square pattern and in a corner bevel pattern about the respective said hub opening.

2. A ventilating apparatus as claimed in claim 1, wherein said air distribution plate is positioned above said fan unit.

3. A ventilating apparatus as claimed in claim 1, wherein said air deflecting surfaces in said air exit areas are provided by settable punched elements in said air distribution plate.

4. A ventilating apparatus as claimed in claim 3, wherein said air distribution plate further includes elongated holes therein located between said punched elements in said air exit areas and as well in areas outside of said air exit areas.

5. A ventilating apparatus as claimed in claim 1:
   wherein said air distribution plate is flat;
   wherein said air passage openings are made by fully punched out elements; and
   wherein said air deflecting surfaces are made simultaneously or after a punching of said fully punched out elements and are made by bending of partially punched out elements.

6. A ventilating apparatus as claimed in claim 5;
   wherein said air distribution plate is nonmetallic; and
   wherein said air passage openings are punched out elongated holes.

7. A ventilating apparatus as claimed in claim 5, wherein said air deflecting surfaces are curved.

8. A ventilating apparatus as claimed in claim 5, wherein said air deflecting surfaces are planar.

9. A ventilating apparatus as claimed in claim 5, wherein each said partially punched out element includes web connections to said air distribution plate at spaced locations such that, after bending, each said partially punched out element forms a said air distribution surface with respective sides thereof extending oppositely beyond a plane of said air distribution plate and air passage openings on either respective side of said partially punched out element.

10. A ventilating apparatus as claimed in claim 9, wherein each said partially punched out element is rectangular and said connections form a control axis about which said partially punched out element is bent.

11. A ventilating apparatus as claimed in claim 9, and further including an additional element secured to at least one said partially punched out element to at least partially close an adjacent air passage opening on a respective side of said at least one partially punched out element.

* * * * *